(12) United States Patent
Diener

(10) Patent No.: US 11,459,278 B2
(45) Date of Patent: Oct. 4, 2022

(54) COATING METHOD FOR ENERGETIC MATERIAL AND COATING SYSTEM FOR COATING ENERGETIC MATERIAL USING SAID TYPE OF COATING METHOD

(71) Applicant: Christof-Herbert Diener, Nagold (DE)

(72) Inventor: Christof-Herbert Diener, Nagold (DE)

( * ) Notice: Subject to any disclaimer, the term of this patent is extended or adjusted under 35 U.S.C. 154(b) by 0 days.

(21) Appl. No.: 17/601,365

(22) PCT Filed: Apr. 9, 2020

(86) PCT No.: PCT/EP2020/060242
§ 371 (c)(1),
(2) Date: Oct. 4, 2021

(87) PCT Pub. No.: WO2020/208178
PCT Pub. Date: Oct. 15, 2020

(65) Prior Publication Data
US 2022/0144719 A1    May 12, 2022

(30) Foreign Application Priority Data

Apr. 11, 2019    (DE) ..................... 10 2019 205 276.2

(51) Int. Cl.
  *B05D 1/00*    (2006.01)
  *C06B 21/00*   (2006.01)
  *B05D 5/08*    (2006.01)

(52) U.S. Cl.
CPC ............ *C06B 21/0083* (2013.01); *B05D 1/62* (2013.01); *B05D 5/08* (2013.01)

(58) Field of Classification Search
None
See application file for complete search history.

(56) References Cited

U.S. PATENT DOCUMENTS

| | | | |
|---|---|---|---|
| 9,353,021 B2 | 5/2016 | Zhang et al. | |
| 10,125,058 B1 | 11/2018 | Bellitto | |
| 10,173,945 B1* | 1/2019 | Buckner | .............. C01B 6/243 |
| 2004/0250764 A1* | 12/2004 | Nagano | ............... C23C 14/546 |
| | | | 423/349 |
| 2010/0307648 A1 | 12/2010 | Marraud et al. | |

(Continued)

FOREIGN PATENT DOCUMENTS

| | | |
|---|---|---|
| CN | 103342619 | 10/2013 |
| DE | 2820704 | 11/1978 |
| DE | 2820704 | 1/1987 |

(Continued)

OTHER PUBLICATIONS

Ruf, Richard, MD "Office Action issued for German patent application No. 102019205276.2" pp. 1-10 dated Jan. 9, 2020.

(Continued)

*Primary Examiner* — Shamim Ahmed
*Assistant Examiner* — Bradford M Gates
(74) *Attorney, Agent, or Firm* — Jake M. Gipson; Bradley Arant Boult Cummings LLP

(57) ABSTRACT

The invention relates to a coating method for energetic material (12), in particular in a vacuum. The energetic material (12) is coated by chemical or physical vapor deposition. The coating material (16) is electrically conductive and/or hydrophobic or hydrophilic. The energetic material (12) is shaped as grains and/or pellets and/or is in the form of a powder.

9 Claims, 2 Drawing Sheets

(56) References Cited

U.S. PATENT DOCUMENTS

2012/0128896 A1* 5/2012 Tucker .............. C23C 16/4485
118/723 R
2019/0023630 A1 1/2019 Sherman

FOREIGN PATENT DOCUMENTS

| DE | 19521385 | 10/1998 |
| DE | 19742034 | 3/1999 |
| DE | 102004019840 | 11/2005 |
| EP | 1028820 | 8/2000 |
| EP | 1028820 | 12/2009 |
| GB | 2455993 | 7/2009 |

OTHER PUBLICATIONS

Anaram Shahravan et al.: "Passivation of Aluminum Nanoparticles b~ Plasma-Enhanced Chemical Vapor Deposition for Energetic Nanomaterials", ACS Applied Materials & Interfaces, Bd. 6, Nr. 10, Seiten 7942-7947, XP055715185, us May 7, 2014.

Kappen, Sascha "International Written Opinion and Search Report—PCT/EP2020/060242" pp. 1-6.

Kappen, Sascha "English Translation of the International Preliminary Report on Patentability—International patent application No. PCT/EP2020/060242" European Patent Office as IPEA pp. 1-6 dated Jul. 6, 2021.

Anaram Shahravan et al.: "Passivation of Aluminum Nanoparticles b~ Plasma-Enhanced Chemical Vapor Deposition for Energetic Nanomaterials", ACS Applied Materials & Interfaces, Bd. 6, Nr. 10, Senen 7942-7947, XP055715185, us May 7, 2014.

Cranford, Bruce "Energetic Materials; What are they?" Energetic Materials Group Annual Meeting, American Institute of Chemical Engineers Annual Meeting, Philadelphia, PA retrieved from the internet: URL:http://folk.ntnu.no/skoge/prost/proceedings/aiche-2008/data/papers/P125072.pdf [retrieved on Oct. 22, 2020] Nov. 20, 2008.

* cited by examiner though to 11,459,278 B2

COATING METHOD FOR ENERGETIC MATERIAL AND COATING SYSTEM FOR COATING ENERGETIC MATERIAL USING SAID TYPE OF COATING METHOD

CROSS-REFERENCE TO RELATED APPLICATIONS

This application is a national stage under 35 U.S.C. 371 of International Application No. PCT/EP2020/060242 having an international filing date of 9 Apr. 2020 (currently pending). International Application No. PCT/EP2020/060242 cites the priority of German Patent Application No. 102019205276.2, filed on 11 Apr. 2019.

TECHNICAL FIELD

The invention relates to a coating method for energetic material and/or components of the energetic material, which is in the form of grains, pellets and/or a powder, with a coating material. The invention further relates to chemical modifications of the surface of the energetic material and/or of components of the energetic material using said type of coating method. Furthermore, the invention relates to a coating system for coating energetic material using the coating method according to the invention. The invention also relates to the provision of an energetic material with a coating.

PRIOR ART

It is known from the prior art that the combustion properties of energetic materials are influenced by suitable coatings on the energetic materials. Coatings can change the pressure-time curve of the combustion process, among other things. In addition, coatings can increase the durability of energetic materials during storage and the reproducibility of the strength of explosion. In other cases, coatings on energetic materials simplify manufacturing processes or reduce the risk of accidents.

In CA939967A, the burn rate of grains of propellants is changed with the aid of solutions containing polyvinyl acetate or plastics containing n-butyl methacrylate or methyl cellulose. A coating based on polyisocyanate, which decelerates the combustion process, is specified in IL47494A. U.S. Pat. No. 6,345,577B1 discloses a coating which slows down the combustion process and contains dihydrozinotetracenes, among other things. Graphite coatings for gunpowder are mentioned in Bailey and Murray (Explosives, Propellants and Pyrotechnics, London, 1989, 94). Graphite coatings protect the gunpowder from moisture and serve as a lubricant when filling cartridges. In addition, the coatings form an electrical conductor to prevent the accumulation of electrical charges. Further coatings for gunpowder lubricants are disclosed in U.S. Pat. No. 5,970,877A. The graphite usually used for coating is at least partially replaced by molybdenum sulfide in a quantity of up to 0.5 percent by weight of the gunpowder.

The aforementioned coating methods each relate to specific coating materials.

The object of the invention is to provide a coating method by means of which different types of coating materials can be distributed over the entire surface of the respective energetic material and/or a component of the energetic material in a short time. It is a further object of the invention to provide a coating system by means of which different types of coating materials can be distributed over the entire surface of the energetic material in a short time. It is a further object of the invention to provide an energetic material with a coating that was produced in particular by the coating method according to the invention.

DISCLOSURE OF THE INVENTION

The coating method according to the invention relates to the coating of energetic material, which is in the form of grains, pellets and/or a powder, and/or of components of an energetic material, in particular metals, with a coating material. The coating method is characterized in that the coating material
   a) is hydrophobic or hydrophilic and/or
   b) is electrically conductive.

The coating allows the properties of the coating material to be transferred to the energetic material or the surface of the energetic material. The coating method is preferably designed as a thin-film coating method. The coating material is, in particular, moisture-repellent, chemically inert, antistatic, and anticorrosive. The coating material can be designed to be electrically conductive if it contains, for example, poly-3,4-ethylenedioxythiophene (PEDOT), To protect against corrosion, the coating material can comprise plasma polymers, paraffin, nickel and/or parylene, among other things. By coating using the coating method according to the invention, the emission of nitrogen oxides can be reduced. In the context of the coating method, coatings of energetic material can be produced which contain ureas and similarly acting compounds, among other things if the coating is carried out with a plasma containing ammonia ($NH_3$) and carbon dioxide ($CO_2$). In this way, shooters who use such a coated energetic material and weapons comprising such a coated energetic material can be protected from nitrous acid and thus, in the case of weapons, from corrosion. The coating method can be used to coat individual components of energetic material, including magnesium, aluminum, titanium and/or other metals. The coating material can be sealing, insulating and/or resistant to solvents. Muzzle flash can be increased, reduced and/or adjusted by coating energetic materials. The coatings and/or modifications can be designed as marking means. A marking in the form of a coating agent serves to protect against plagiarism and/or as an anti-terrorist means. The coating material can modify the combustion behavior and/or the burn rate of the energetic material. The coating material can be designed as a lubricant, in particular for bullets and cartridges. The coating material can chemically modify the surface of the energetic material. The surface of an energetic material can be functionalized by the coating. The coating can only be one atomic layer thick.

In particular, the coating is carried out by chemical vapor deposition (CVD) or physical vapor deposition (PVD) in a vacuum. The fact that the coating takes place in a vacuum means in particular that the pressure in the vacuum chamber in which the coating takes place is less than one bar, in particular less than one millibar. Using said type of coating methods, different types of coating materials can be distributed over the entire surface of the energetic material present or components of the energetic material, such as grains or pellets, in a short time. The vacuum brings about an additional drying effect, which is particularly advantageous when coating gunpowder. In particular, the coating method is carried out by vapor deposition, gassing or sputtering.

The coating in the coating method can be carried out by mass-produced small parts coating in a mass-produced small part coating system.

Energetic materials such as propellants and explosive powders, grains or pellets are used, among other things, in weapon systems, in military and civilian pyrotechnic devices, for fireworks, for distress signals, gas generators, in particular gas generators for airbags, for industrial processes involving explosions or for demolitions. If not properly stored or used, many of these energetic materials can absorb moisture from the air, water, rendering them useless. Other energetic materials, such as some heterogeneous pyrotechnic mixtures and powders, decay (for example due to the reaction of magnesium with moisture from the air, releasing hydrogen) or ignite under adverse circumstances and thus cause serious accidents. For example, black powder (a mixture of potassium nitrate, sulfur and charcoal in the form of grains), pyrotechnic pellets containing metal, smokeless powder and other explosives, especially hygroscopic explosives, in the form of a powder or grains.

Therefore, suitable coatings for propellants, explosives and pyrotechnic grains represent potential solutions for various tasks, including: methods for waterproofing, hydrophilizing, removing electrical charges, lubricating surfaces of explosives, for example for filling ammunition boxes or for marking against terrorist use.

A further problem with propellants for weapons and rocket propulsion is controlling the burn rate. The speed of the combustion process can be reduced by means of suitable inhibiting surface coatings, for example by the propellant burning gradually through the surface coating. This applies to smokeless powders of all types and shapes such as cylindrical and spherical shapes as well as black powder and pyrotechnic grains and pellets.

The components of energetic materials contain in particular oxidizing agents, including ammonium nitrate, strontium nitrate, barium nitrate, and/or reducing agents, including sulfur, carbon, metal powder, in particular with aluminum, magnesium, and titanium.

By means of the coating method according to the invention in a vacuum, the surface of propellants and explosives in the form of a powder, grains and pellets is coated with a coating having a thickness of 0.1 nanometers or more. The coating is in particular chemically inert, hydrophobic, hydrophilic and/or electrically conductive. The coating can be used as a lubricant or as a marker. Additionally or alternatively, the surface of the energetic material is chemically modified.

Hydrophobic coatings repel moisture in the air and prevent undesired changes in the physical properties, in particular the combustion and explosive behavior of propellants in a pyrotechnic composition or explosives. In particular, in the case of black powder pellets, water contact angles can change from 20° to 120° by a coating using plasma. In addition, the burn rate of explosives can be influenced by the coatings.

On the other hand, hydrophilic coatings can increase the wettability of hydrophobic explosives and enable the production of explosive materials in the form of slurries, suspensions and/or aqueous gels. The water contact angle, especially with trinitrotoluene (TNT), can be changed from 94.5° to less than 20° by coating methods with plasma.

In particular, perfluoroacrylates (including PFAC6, PFAC8) as a coating material have strongly hydrophobic properties. Energetic material, in particular black powder, which is coated with a perfluoroacrylate, e.g. PFAC8, as a coating material according to the coating method according to the invention, is largely dry even 24 hours after contact with water.

The coating materials can have protective layers containing nickel, chromium, manganese. The coating materials can be sputtered and/or vapor-deposited.

The coating materials in particular have at least one chemical for hydrophobing, preferably with at least one $CH_3$ group and/or one $CF_3$ group.

In the case of energetic materials in the form of grains, an important factor influencing the combustion rate of energetic materials is the area of the combustible surface of said grains. The combustion process of the grains can be controlled by completely or partially coating the combustible surface with a coating material that decelerates the combustion process.

One embodiment of the coating method is characterized in that the energetic material comprises an explosive, a pyrotechnic composition and/or a propellant. In the context of the application, explosives are understood to mean in particular substances that release energy in the form of a pressure wave when a chemical reaction occurs. A pyrotechnic composition comprises in particular an oxidizing agent and a fuel. The coating method can also be used to coat fuses and/or pyrotechnic devices.

One embodiment of the coating method is characterized in that the energetic material has an explosion heat of more than 2500 kJ/kg and/or a burn rate of more than 30 m/s and/or a Trauzl number of more than 30 $cm^3$. In particular, the energetic material has an explosion heat of 2500 kJ/kg to 7000 kJ/kg and/or a burn rate of 50 m/s to 8000 m/s, preferably a burn rate of 2000 m/s to 5000 m/s, and/or a Trauzl number of 300 $cm^3$ to 550 $cm^3$.

A further embodiment of the coating method is characterized in that the energetic material contains black powder, smokeless powder, nitroglycerine and/or nitrocellulose. In particular, the energetic material contains picric acid, hydrazine, trinitrotoluene (TNT), glycol dinitrate, nitropenta and/or initiating explosives.

One embodiment of the coating method is characterized in that the coating material contains halogens; monomers containing at least one halogen; silicon; monomers containing silicon; silazanes, in particular hexamethyldisilazane; siloxanes; silanes; fluorine; hydrocarbon; in particular saturated and/or unsaturated hydrocarbon; aliphatic hydrocarbon; aromatic hydrocarbon; derivatives of aliphatic hydrocarbon and/or aromatic hydrocarbon, in particular containing heteroatoms; oxygen; conductive polymers; alkanes, in particular fluoroalkanes; cycloalkanes; mixtures containing alkanes and halogens; alkenes, mixtures containing alkenes and halogens; hexamethyldisiloxane; fluoroacrylates; octafluorocyclobutane; ethine; parylene; paraffin; octene; hexafluoroethane; perfluoroacrylate; acrylic acid and/or combinations of the aforementioned substances.

An advantageous embodiment of the coating method is characterized in that the coating takes place at a pressure of a maximum of 10 millibars and/or a temperature of a maximum of 130° Celsius. The vapor deposition processes for coating energetic materials can be carried out particularly efficiently in such a temperature range and such a pressure range.

An advantageous embodiment of the coating method is characterized in that the coating is carried out by plasma-enhanced chemical vapor deposition. With plasma-enhanced chemical vapor deposition (PECVD), temperature-sensitive energetic materials can also be coated. In particular, atmospheric pressure plasma can be used for the coating. Plasma polymerization is preferably used as an embodiment of the coating method.

The respective energetic material is preferably coated in a vacuum chamber which is rotated about an axis of rotation running in the horizontal direction during vapor deposition. The energetic material, in particular grains of the energetic material, is moved up and down in the vertical direction. The energetic material is distributed in the vacuum chamber. As a result, the entire surface of the energetic material or grains of the energetic material can be coated.

The plasma is advantageously ignited by an electrode in the vacuum chamber which is coated in particular with an electrical insulator, preferably glass or ceramics. Among other things, the insulator prevents voltage breakdowns between the electrode and its surroundings.

A further embodiment of the coating method is characterized in that the coating is applied with a thickness of more than 0.1 nanometers, in particular a thickness of more than 10 nanometers and in particular a maximum thickness of two micrometers. The thickness can be between 0.1 nanometers and 10 nanometers, in particular 1 nanometer and 5 nanometers. The coating is preferably applied with a thickness of 100 nanometers to 1.5 micrometers, particularly preferably with a thickness of 700 nanometers to one micrometer.

A coating system for coating energetic material according to one of the aforementioned embodiments comprises a vacuum chamber which has an inlet for gas. The coating system is characterized in that the chamber is rotatable by a shaft arranged on the chamber and running in the horizontal direction and in that there is coated energetic material in the chamber. In said type of coating system, the energetic material is distributed during the coating method through a vertical upward and downward movement in the vacuum chamber. As a result, the entire surface of the energetic material can be coated, or the respective entire surface of grains of the energetic material can be coated. The rotation of the vacuum chamber causes the energetic material to circulate. The coating material is distributed around the grains of the energetic material. Fluidized beds of the energetic material are formed. The use of a closed vessel for the coating method, here in the form of the vacuum chamber, prevents the energetic material from being distributed over an uncontrollably large area.

A further development of the coating system is characterized in that the chamber comprises an electrode coated with an electrically insulating material, in particular glass or ceramics. The insulating material prevents, among other things, voltage breakdowns between the electrode and its surroundings.

Energetic material with a coating applied according to the coating method according to the invention is characterized in that the coating contains halogens; monomers containing at least one halogen; silicon; monomers containing silicon; silazanes, in particular hexamethyldisilazane; siloxanes; silanes; fluorine; hydrocarbon; in particular saturated and/or unsaturated hydrocarbon; aliphatic hydrocarbon; aromatic hydrocarbon; derivatives of aliphatic hydrocarbon and/or aromatic hydrocarbon, in particular containing heteroatoms; oxygen; conductive polymers; alkanes, in particular fluoroalkanes; cycloalkanes; mixtures containing alkanes and halogens; alkenes, mixtures containing alkenes and halogens; hexamethyldisiloxane; fluoroacrylates; octafluorocyclobutane; ethine; parylene; paraffin; octene; hexafluoroethane; acrylic acid and/or combinations of the aforementioned substances.

One embodiment of the energetic material is characterized in that the energetic material comprises grains with a size of more than 0.01 millimeters, in particular a size of a maximum of 1 meter. In other embodiments, the size of the grains can be more than 1 meter. The term "size" refers in particular to the diameter, in this case the grain. The energetic material preferably comprises grains of a size of 1 millimeter to 50 centimeters, particularly preferably 5 millimeters to 5 centimeters.

A further embodiment of the energetic material is characterized in that the coating has a thickness of more than 0.1 nanometers, in particular a thickness of more than 10 nanometers and in particular a thickness of a maximum of two micrometers. The thickness can be between 0.1 nanometers and 10 nanometers, in particular 1 nanometer and 5 nanometers. The coating is preferably applied in a thickness of 500 nanometers to 1.5 micrometers, particularly preferably with a thickness of 700 nanometers to one micrometer.

The invention relates in particular to coatings and/or modifications or chemical changes to the surface of energetic materials, including propellants, pyrotechnic compositions and explosives, preferably in the form of a powder, grains or pellets, in particular by means of cold plasma. The coatings and/or modifications can be liquid-repellent or hydrophobic. The coatings and/or modifications can be designed in such a way that they change the burn rate of the energetic materials. The coatings and/or modifications can be designed to be electrically conductive and/or antistatic. The coatings and/or modifications can be designed as lubricants. The coatings and/or modifications can increase the wettability of the energetic materials, in particular with regard to water and organic solvents. The coatings and/or modifications can be sealing, insulating and/or resistant to solvents. The coatings and/or modifications can be designed as marking means. The coatings and/or modifications can be formed in a chemical vapor deposition process, for example using parylenes, or a plasma-enhanced chemical vapor deposition process, in particular at a pressure which is less than or equal to atmospheric pressure. In particular, fluorine-based or silicone-based spray can be used for the coating, including shoe spray.

The coatings and/or modifications can be formed in a physical vapor deposition process, for example using gases containing paraffin. The coatings and/or modifications can be formed in a rotating container, a container filled with liquid, with falling movements of grains of the energetic material or by mechanical mixing. The coatings and/or modifications can be formed using a coating material, wherein the coating material contains monomers containing at least one halogen, silicon, monomers containing silicon, siloxanes, silazanes, silanes, fluorine or hydrocarbon, in particular saturated and/or unsaturated hydrocarbon, aliphatic hydrocarbon, aromatic hydrocarbon, derivatives of aliphatic hydrocarbon and/or aromatic hydrocarbon, in particular containing heteroatoms, oxygen, conductive polymers, alkanes, in particular fluoroalkanes, cycloalkanes, mixtures containing alkanes and halogens, alkenes, mixtures containing alkenes and halogens, hexamethyldisiloxane, fluoroacrylate, octafluorocyclobutane, ethyne, parylene, paraffin, octene and/or hexafluoroethane, conductive polymers, acrylic acid or combinations of the aforementioned substances.

BRIEF DESCRIPTION OF THE DRAWINGS

Further features and advantages of the invention are apparent from the following detailed description of embodiments of the invention with reference to the accompanying drawings, which show details essential to the invention. The various features can each be implemented individually for themselves or for a plurality of combinations of any kind in variants of the invention. The features shown in the drawings are shown in such a way that the special features according to the invention can be made clearly visible.

In the drawings.

EMBODIMENTS OF THE INVENTION

In a first embodiment of the invention, black powder in the form of pellets was chosen as the hygroscopic propellant. Before coating, a water drop of one microliter of pure water has a water contact angle of 23.2° five seconds after being placed on the surface of the pellet. The water drop is completely absorbed in 15 seconds.

After being coated with hexamethyldisiloxane for ten minutes, a water drop of one microliter of pure water has a water contact angle of 118.4° five seconds after being placed on the surface of the pellet. Four minutes after placement, the water contact angle is 105.7°.

In a second embodiment of the invention, black powder in the form of pellets is coated with 1-octene for 10 minutes. A water drop of one microliter of pure water has a water contact angle of 122.7° five seconds after being placed on the surface of the pellet. Four minutes after placement, the water contact angle is 91.2°.

In a third embodiment of the invention, black powder in the form of pellets is coated with perfluoroacrylate (PFAC 8) for 20 minutes. A drop of one microliter of pure water has an almost superhydrophobic water contact angle of 135.5° five seconds after being placed on the surface of the pellet. Four minutes after placement, the water contact angle is 111.0°.

In a fourth embodiment of the invention, a propellant with nitrocellulose in smokeless powder in a 9×19 mm cartridge is coated twice with hexamethyldisiloxane for 20 minutes each time.

In a fifth embodiment of the invention, a propellant with nitrocellulose in smokeless powder in a 9×19 mm cartridge is coated twice with 1-octene for 20 minutes each time.

In a sixth embodiment of the invention, a propellant with nitrocellulose in smokeless powder in a 9×19 mm cartridge is coated twice with perfluoromonomer 8 or perfluoroacrylate 8 (PFAC 8) for 20 minutes each time.

In a seventh embodiment of the invention, a propellant with nitrocellulose in smokeless powder in a 9×19 mm cartridge is coated twice with nitrogen trifluoride ($NF_3$) for 20 minutes each time.

Figure 1:
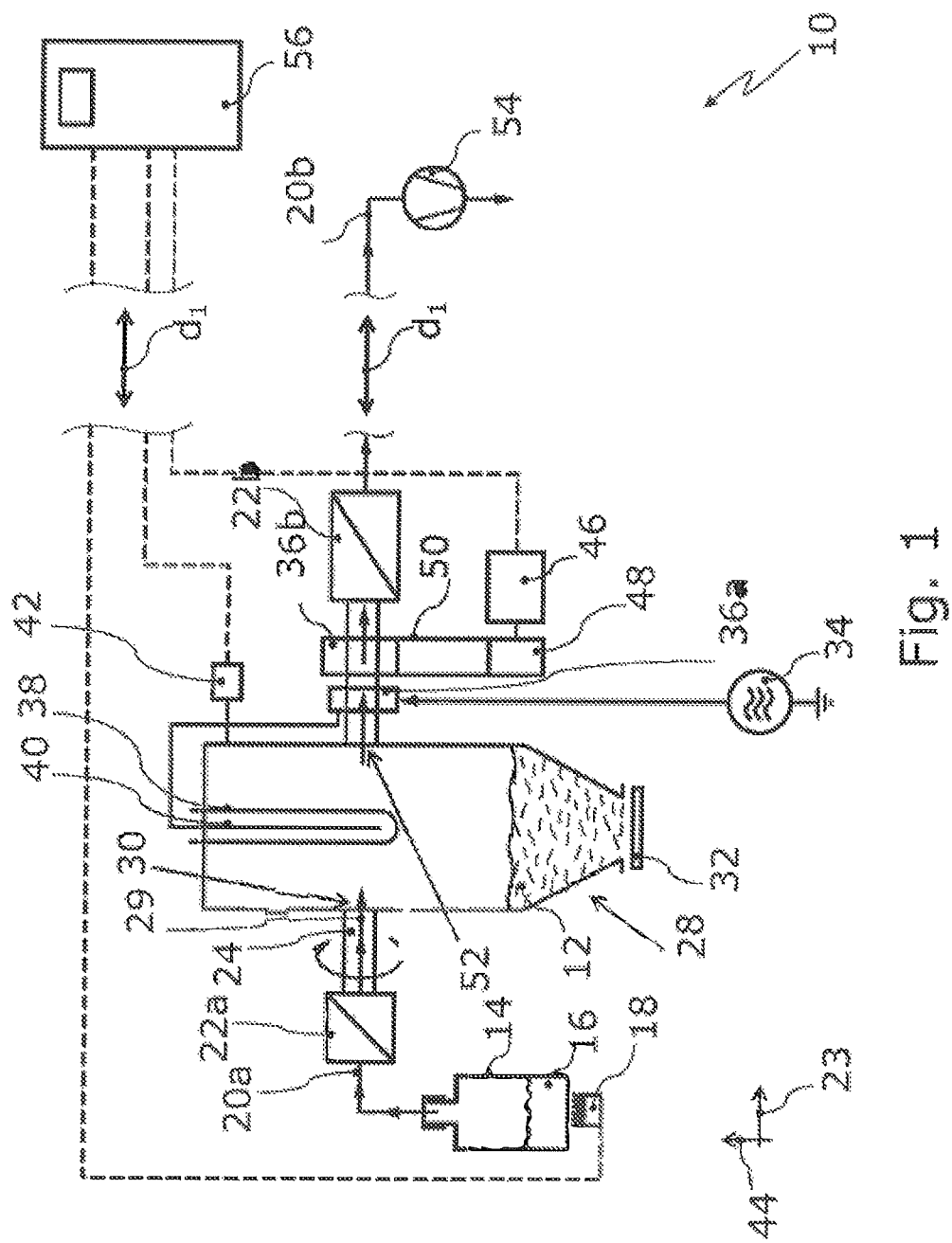
FIG. 1 shows a coating system for coating energetic material.

In FIG. 1, a coating system 10 for coating energetic material 12 is shown. The coating system 10 comprises a gas container 14 in which there is a coating material 16 that is evaporated into a coating gas, in particular by a heating element 18 outside the gas container 14. A first fluidic connection 20a leads from the gas container 14 to a fluidically conductive first rotary vacuum feedthrough 22a. The first rotary vacuum feedthrough 22a engages around a shaft 24 which is rotatable about an axis of rotation running in the horizontal direction 23. The shaft 24 is attached to opposite sides of a vacuum chamber 28 which can be rotated by the shaft 24. The coating gas flows in the form of a gas flow 29 through the fluidically conductive shaft 24 and enters the vacuum chamber 28 through a coating gas inlet 30.

The vacuum chamber 28 is closed by a cover 32. The energetic material 12 that is to be coated, for example black powder, as well as plasma (not shown) are located in the vacuum chamber 28. To generate the plasma, a voltage source as a plasma generator 34 is connected via a first slip ring 36a on the shaft 24 to an electrode 40 in the vacuum chamber 28, which electrode is provided with an insulating layer 38, here in the form of ceramics. A pressure measuring device 42 measures the pressure in the vacuum chamber 28.

The molecules of the coating gas are dissociated by the plasma. The energetic material 12 is coated with components of the dissociated coating gas. As a result of the rotation of the vacuum chamber 28 with the horizontally running shaft 24, the energetic material 12 is moved up and down in the vacuum chamber 28 in the vertical direction 44. The energetic material 12 is in particular in the form of grains. By moving the grains in the vertical direction 44, the grains do not collect in one place ("at the bottom" of the vacuum chamber) for a long time and can all be coated.

The shaft 24 is rotated by a motor 46 connected to a gear 48. The gear 48 transmits the rotary movement of the motor 46 through a chain 50 to a second slip ring 36b which engages around the shaft 24.

The remaining components of the coating gas that are not used in the coating flow through a coating gas outlet 52 which is opposite the coating gas inlet 30. The coating gas then flows through a second rotary vacuum feedthrough 22b. The remaining components of the coating gas then exit the coating system 10 through a second fluid connection 20b and a vacuum pump 54. The coating system 10 is controlled by a controller 56. The vacuum pump 54 and the controller 56 are preferably located at a distance $d_1$ of more than 1 meter, preferably more than three meters, from the other components of the coating system 10.

Figure 2:
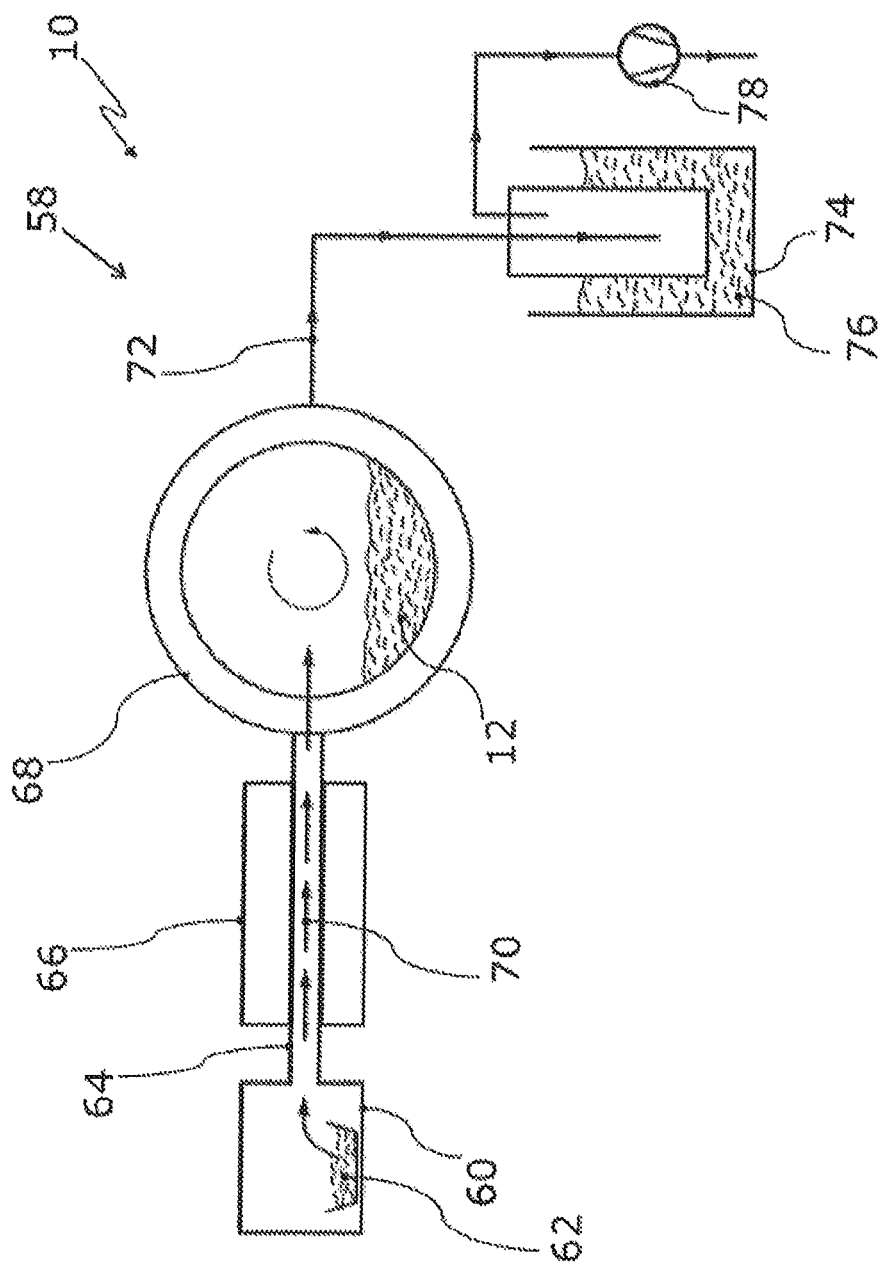
FIG. 2 shows a parylene system for coating energetic material.

In FIG. 2, a parylene system 58 for coating energetic material 12 is shown as the coating system 10. The parylene system 58 comprises a parylene vaporizer 60 for vaporizing parylenes 62 at approximately 250° C. A tubular fluidic connection 64 leads from the parylene vaporizer 60 through a pyrolysis tube 66 to a rotating drum 68. The parylene emerges as a parylene gas flow 70 from the parylene vaporizer 60 and flows through the pyrolysis tube 66, which is designed in particular as a resistance heater.

When flowing through the pyrolysis tube 66, the parylene is broken down into monomers at about 650° C. The parylene then flows through the fluidic connection 64 into the rotating drum 68, in which energetic material 12 is located. The energetic material 12 is circulated by rotating the rotating drum and coated with the parylene at about 20° C. The remaining parylene monomers are conveyed out of the rotating drum through a second fluidic connection 72 and polymerized in a cold trap 74 of the parylene system at about −196° C. For this purpose, the cold trap 74 comprises liquid nitrogen ($LN_2$) 76. The parylene is then conveyed out of the cold trap 74 by a vacuum pump 78 of the parylene system 58.

Taking into account the drawings, the invention relates in summary to a coating method for energetic material 12, in particular in a vacuum. The energetic material 12 is coated by chemical or physical vapor deposition. The coating material 16 is electrically conductive and/or hydrophobic or hydrophilic. The energetic material 16 is shaped as grains and/or pellets and/or is in the form of a powder. The coating is particularly preferably carried out in a plasma. The coating is more preferably carried out in the form of a plasma polymerization. Energetic materials are understood to mean in particular explosives and pyrotechnic compositions, propellants, fuels and/or battery materials. It must be taken into account that a coating is understood to mean not only the accumulation of a layer, but also the transformation of a layer. For example, in the case of a plasma treatment of smokeless powder with $NF_3$, there is no NO deposition, but a corridor addition of the surface. The aim of the treatment is to increase or decrease the burn rate of the energetic material, to increase the conductivity of the electrical material to protect against electrical discharges, to minimize nitrogen oxides to protect against corrosion, to achieve protection against plagiarism and/or to improve lubrication, to make the energetic material hydrophobic to protect against corrosion or to achieve better miscibility of the energetic material with water by hydrophilizing.

The invention claimed is:

1. A coating method for energetic material (12), which is in the form of grains, pellets and/or a powder, with a coating material (16), characterized in that the coating material (16)
    a) is hydrophobic or hydrophilic and/or
    b) is electrically conductive,
wherein the energetic material (12) comprises black powder, nitroglycerin and/or nitrocellulose, wherein the coating method is carried out by plasma-enhanced chemical vapor deposition, wherein the energetic material is coated in a vacuum chamber (28) which is rotated about an axis of rotation running in a horizontal direction during vapor deposition.

2. The coating method according to claim 1, characterized in that the energetic material (12) comprises an explosive, a pyrotechnic composition and/or a propellant.

3. The coating method according to claim 1, characterized in that the energetic material (12) has an explosion heat of more than 2500 kJ/kg, a burn rate of more than 30 m/s and/or a Trauzl number of more than 30 $cm^3$.

4. The coating method according to claim 1, characterized in that the coating material (16) contains halogens; monomers containing at least one halogen; silicon; monomers containing silicon; silazanes; siloxanes; silanes; fluorine; hydrocarbon; aliphatic hydrocarbon; aromatic hydrocarbon; derivatives of aliphatic hydrocarbon and/or aromatic hydrocarbon; oxygen; conductive polymers; alkanes; cycloalkanes; mixtures containing alkanes and halogens; alkenes, mixtures containing alkenes and halogens; hexamethyldisiloxane; fluoroacrylates; octafluorocyclobutane; ethine; parylene; paraffin; octene; hexafluoroethane; acrylic acid and/or combinations thereof.

5. The coating method according to claim 1, characterized in that the coating takes place at a pressure of a maximum of 10 millibars and/or a temperature of a maximum of 130° Celsius.

6. The coating method according to claim 1, characterized in that the plasma is ignited by an electrode (40) in the vacuum chamber (28), wherein the electrode is coated with an electrical insulator (38).

7. The coating method according to claim 5, characterized in that the coating material is applied with a thickness of more than 0.1 nanometers.

8. A coating system (10) for coating energetic material (12) according to claim 7 with a vacuum chamber (28) which has an inlet (30) for gas, characterized in that the vacuum chamber (28) is rotatable by a shaft (24) arranged on the vacuum chamber (28) and running in a horizontal direction and in that there is coated energetic material in the vacuum chamber (28).

9. The coating method according to claim 7, characterized in that the chamber comprises an electrode (40) coated with an electrically insulating material (38).

* * * * *